US009689943B2

(12) United States Patent
Neji et al.

(10) Patent No.: US 9,689,943 B2
(45) Date of Patent: Jun. 27, 2017

(54) METHOD AND MAGNETIC RESONANCE SYSTEM FOR AUTOMATED DETERMINATION OF AN ACQUISITION VOLUME RELATED TO AN EXAMINATION REGION FOR THE ACQUISITION OF A MAGNETIC RESONANCE DATA SET (71) Applicants: Radhouene Neji, Erlangen (DE); Martin Requardt, Nuremberg (DE)

(72) Inventors: Radhouene Neji, Erlangen (DE); Martin Requardt, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 732 days.

(21) Appl. No.: 14/099,087

(22) Filed: Dec. 6, 2013

(65) Prior Publication Data
US 2014/0159723 A1 Jun. 12, 2014

(30) Foreign Application Priority Data
Dec. 6, 2012 (DE) .................. 10 2012 222 411

(51) Int. Cl.
*G01R 33/48* (2006.01)
*G01R 33/483* (2006.01)
(Continued)

(52) U.S. Cl.
CPC ........ *G01R 33/483* (2013.01); *G01R 33/4838* (2013.01); *G01R 33/543* (2013.01); *G01R 33/5608* (2013.01)

(58) Field of Classification Search
CPC .. G03G 33/483; G03G 33/56; G03G 33/5608; G01R 33/56; G01R 33/4833; G01R 33/543; A61B 5/055; A61B 6/03
See application file for complete search history.

(56) References Cited

U.S. PATENT DOCUMENTS 6,828,787 B2    12/2004 Oesingmann
2007/0133852 A1*  6/2007 Collins .................... A61B 8/08
                                                    382/128
(Continued)

FOREIGN PATENT DOCUMENTS

CA    WO 2013040673 A1 *  3/2013 ............... A61B 6/03

OTHER PUBLICATIONS

Anquez J. et al., "Segmentation of the Fetal Envelope on Ante-Natal MRI"; IEEE International Symposium on Biomedical Imaging From Nano to Macro, (2010) pp. 896-899.
(Continued)

*Primary Examiner* — Clayton E Laballe
*Assistant Examiner* — Ruifeng Pu
(74) *Attorney, Agent, or Firm* — Schiff Hardin LLP (57) ABSTRACT In a computerized method and apparatus to automatically determine an acquisition volume of an examination region for the acquisition of a magnetic resonance data set, at least one magnetic resonance image data set is acquired that at least partially images an examination region, and the magnetic resonance image data set is processed into at least one magnetic resonance image. The examination region is segmented and at least one envelope enclosing a segment is determined. At least one rectangle including the envelope is determined. The acquisition volume is calculated using the rectangle.

11 Claims, 3 Drawing Sheets

(51) Int. Cl.
*G01R 33/54* (2006.01)
*G01R 33/56* (2006.01)

(56) References Cited

U.S. PATENT DOCUMENTS

| | | | |
|---|---|---|---|
| 2007/0191703 A1 | 8/2007 | Graf | |
| 2008/0103383 A1* | 5/2008 | van der Kouwe | A61B 5/055 600/410 |
| 2008/0212863 A1* | 9/2008 | Goto | A61B 5/055 382/131 |
| 2008/0231273 A1* | 9/2008 | Kabasawa | G01R 33/56 324/309 |
| 2009/0157350 A1* | 6/2009 | Salazar-Tio | G01N 24/081 702/179 |
| 2009/0214090 A1* | 8/2009 | Hayes | A61B 5/055 382/128 |
| 2009/0281415 A1* | 11/2009 | Cupps | A61B 5/055 600/410 |
| 2011/0123077 A1* | 5/2011 | Goto | A61B 6/5247 382/128 |
| 2012/0056622 A1 | 3/2012 | Scholl | |
| 2012/0062225 A1* | 3/2012 | Ikezaki | G01R 33/5608 324/307 |
| 2014/0198979 A1* | 7/2014 | Hamarneh | A61B 6/03 382/154 |

OTHER PUBLICATIONS

Venugopal et al: "Automatiec Conformal Prescription of Very Selective Saturation Bands for In-vivo 1H-MRSI of the Prostate," NMR in Biomedicine, vol. 25 (2011) pp. 643-653.

Freeman et al., "Determining the Minimum-Area Encasing Rectangle for an Arbitrary Closed Curve," Communications of ACM, vol. 10, No. 7, (1975) pp. 409-413.

Shamos "Computational Geometry," Yale University Dissertation (1978).

Khurd et al., "Facilitating 3D Spectroscopic Imaging Through Automatic Prostate Localization in MR Images Using Random Walker Segmentation Initialized Via Boosted Classifiers," (2011).

* cited by examiner

METHOD AND MAGNETIC RESONANCE SYSTEM FOR AUTOMATED DETERMINATION OF AN ACQUISITION VOLUME RELATED TO AN EXAMINATION REGION FOR THE ACQUISITION OF A MAGNETIC RESONANCE DATA SET

BACKGROUND OF THE INVENTION

Field of the Invention

The present invention concerns a method and magnetic resonance system for automated determination of an acquisition related to an examination region for acquisition of a magnetic resonance data set.

Description of the Prior Art

To acquire magnetic resonance data sets, energy is always injected (radiated) into a three-dimensional volume with a transmission coil. The volume can be significantly smaller in one direction (the direction of what is known as the slice gradient) than in the two other spatial directions. Such a situation is referred to as the excitation of a slice—this is primarily the case in two-dimensional imaging, as well as in spectroscopic imaging. In contrast to this, the term "excitation volume" is prevalent in three-dimensional imaging and spectroscopic experiments. As used herein, the designation "acquisition volume" means the volume excited by energy injection within the scope of the acquisition of a magnetic resonance data set (and in fact of both an image data set and a spectroscopy data set) and read out during the readout phase, this volume delivering a signal contribution.

If portions of the excited volume are not situated in the read-out volume (as is known in some methods of "Arterial Spin Labeling" and "Time of flight" flow imaging, for example), these parts are not included in the resulting image. These are volumes that are prepared for saturation of moving spins and are situated outside of the acquisition volume, although spins flow from these external volumes into the acquisition volume. The acquisition volume is also designated as a volume of interest or VOI.

The excitable or excited volume is relatively freely adjustable in the slice direction. The minimum height of the volume is predetermined by the excitation pulse that is used (namely, its shape) and the gradient strength in the spatial direction in which the gradient is applied during the radiation of the excitation pulse. Since the slice direction is freely selectable, different minimum slice thicknesses accordingly result in different spatial directions.

The examination subject, however, is to be imaged (or data acquired therefrom) in the entire excited region in both of the other spatial directions (called the read direction and phase direction). In imaging acquisitions, a phenomenon known as aliasing (folding) can arise, meaning that the truncated part of the examination subject on the other side of the image migrates into the image and this leads to superpositions with other segments of the examination subject that are imaged there.

In contrast to this, in spectroscopic experiments without volume selection the problem exists that a superposition of desired and unwanted signals always results upon acquisition of signals from all regions of the examination subject within the field of view or radiation pattern of the coil; for example, signal intensities from different body regions superimpose in the spectrum generated from the raw data.

In order to limit the acquired signal to specific regions, different types of "single voxel spectroscopy" have been developed. In such methods, tissue surrounding the acquisition volume is saturated with a preparation module within the pulse sequence, and signals are subsequently acquired from the acquisition volume and the surrounding volume. Due to the pre-saturation, the tissue outside of the acquisition volume no longer delivers any contribution, or delivers almost no contribution.

The term 'saturation" is generally understood as meaning that a volume is excited by means of an RF pulse or excitation pulse so that the longitudinal magnetization flips by 90° out of the steady state. A spoiler gradient is subsequently switched (activated) that dephases this magnetization, so it is no longer detectable. The procedure to thus saturate the magnetization outside of the acquisition volume is categorized under the term "outer volume suppression" (OVS). The volume in which magnetization is saturated with an RF pulse is called a saturation band. Multiple saturation bands are required to saturate the tissue outside of an acquisition volume; normally eight to twenty saturation bands are used.

In addition to this, it is known to selectively excite the acquisition volume, for example by means of a sequence of one 90° pulse and two 180° pulses. The method is called PRESS. However, it is disadvantageous that essentially only cuboid volumes can be excited.

In the acquisition of a magnetic resonance data set with the use of OVS, the procedure is typically executed as follows. One or more overview images are acquired first. In these images, the acquisition volume is marked or segmented by a user evaluates the images manually. This volume is further simplified so that it has an evaluable number of sides or individual surfaces. After this, the saturation bands are automatically placed around the acquisition volume so that the signal contribution from outside the acquisition volume is minimal. The actual data acquisition then takes place. The acquisition volume thus is surrounded by the saturation bands, i.e., its boundaries are established or defined by these saturation bands.

For example, this method to acquire a magnetic resonance data set is known from Venugopal et al., "Automatic conformal prescription of very selective saturation bands for in vivo 1H-MRSI of the prostate", NMR Biomed. 2012, 25: 643-653. In this method, a complete automation is still not achieved because the acquisition volume or, respectively, the examination subject using which the saturation bands are placed is to be segmented manually.

SUMMARY OF THE INVENTION

An object of the present invention is to provide a method and a magnetic resonance system with which the acquisition volume can be established automatically.

According to the invention, at least one magnetic resonance image data set is initially acquired that at least partially images an examination region. In a preferred embodiment, multiple two-dimensional image data sets can be acquired simultaneously. For example, this is possible in spin echo or turbo spin echo sequences, wherein the wait time during the relaxation of the longitudinal magnetization in one slice is used to acquire other slices. Naturally, the individual images can also be acquired in succession. In sequences such as FLASH or TrueFisp, such long wait times with which the simultaneous acquisition of multiple slices can be implemented do not exist, but these sequences require only a fraction of the time that is incurred for the acquisition with a spin echo sequence. Alternatively, a three-dimensional magnetic resonance image data set can also be acquired.

If the acquisition of an image data set is intended, it is naturally intended that the signals originating from the examination subject are detected with a coil or a coil array, directed through multiple electrical devices (for example amplifiers and AD converters), and at least temporarily stored as raw data. The raw data are processed further into image data by post-processing steps and Fourier transformation.

The examination region is subsequently segmented automatically from the magnetic resonance image or images, and the segments obtained in such a manner are stored as a segmentation result.

For each segment, an envelope is subsequently determined that surrounds the examination region imaged in the magnetic resonance image or in the plane. The envelope is naturally not just an arbitrary curve that proceeds around the examination region or its cross section, but rather is a curve that is directed optimally close around the organ and thereby minimizes the circumference (periphery). The envelope is therefore comparable to a string that is placed taut around an article.

In order to describe or establish the envelope, it is sufficient to specify node points. Alternatively, the envelope can be established by an arbitrary number of discrete points. The calculation of the envelope significantly facilitates the subsequent calculation of the rectangle, since the cross section of the examination region typically includes a number of image elements, of which most are irrelevant in the determination of the surrounding rectangle.

A rectangle is subsequently determined that encloses all node points or points of the envelope. In the simplest embodiment, the highest value and lowest value are subtracted from one another in the x-direction and y-direction in the coordinate system of the projection plane, whereby the length and the width of the rectangle and its position are defined. Starting from this rectangle, the acquisition volume can be determined in that its height is furthermore determined. The acquisition parameters are resorted to for this.

A separate envelope and a separate rectangle are determined for each magnetic resonance image or each plane of a three-dimensional magnetic resonance image that images a cross section of the examination region. The height of the respective rectangle is provided by the slice thickness of the magnetic resonance images.

Although the organ is completely included in this embodiment of the determination of the position of the rectangle, a number of envelopes and corresponding rectangles are to be determined.

In an alternative embodiment, multiple segments are projected into one projection plane before determination of the envelope. The projection of the segments can be implemented orthogonal to the sagittal plane; however, it can also be produced in the direction of the major axis of the examination region. All segments are thereby superimposed relative to a single surface.

Due to the projection, all volume portions of the examination region are represented in the projection plane. An envelope surrounding the projected segments therefore encloses the examination region in its entire length. It is thus sufficient to determine a single envelope and a single rectangle surrounding the envelope.

In this alternative, the acquisition volume is fashioned as a cuboid. The position is determined as follows:

At the corner of the rectangle nearest the transverse plane, a first side surface of the acquisition volume is placed parallel to the transverse. The additional side surfaces of the cuboid or acquisition volume are placed by the respective largest and smallest x-values and y-values of the projected segments. A largest and smallest value respectively exist, thus four values in total. These side surfaces are arranged orthogonally to the transverse plane and parallel to the sagittal plane or frontal plane. The last side surface is in turn parallel to the first side surface. All six side surfaces of the cuboid are thus defined.

The readout or phase direction lies in the sagittal plane and parallel to the transverse plane, and the phase direction or readout direction lies in the sagittal plane and parallel to the frontal plane. This is only the pure orientation and direction information since, particularly in spectroscopic imaging, no readout gradient is used, but rather only phase-coding gradients.

The field of view can likewise be predetermined automatically. It can be just as large as the calculated rectangle or the acquisition volume. To avoid aliasing, the field of view can also be larger than the calculated rectangle. It is enlarged by 2 to 3 (in particular 2.5) image element widths in each direction. The number of image elements in the calculated rectangle defines the resolution and the image element width.

As an alternative to the projection in the sagittal plane, a projection of the segment occurs depending on the direction of the major axis of the examination region, in particular of the major axis onto a plane arranged orthogonal to the major axis. With such a projection it is ensured that the determined rectangle is situated optimally orthogonally on the major axis of the examination region, whereby the resulting volume of the acquisition volume is reduced.

Preferably a rectangle is determined that has a minimized, preferably minimal, area. For example, a minimization of the rectangular surface (and therefore of the acquisition volume) can be produced via rotation of the rectangle and subsequent recalculation of the position of the sides. This rotation can be continued in both rotation directions until a reduction of the area no longer occurs. The smaller of the two obtained rectangles is then that one with minimized area.

Although this procedure to determine a minimized area can be implemented very easily, it is not precluded that the global minimum—namely the minimum area—is not achieved. For example, the calculation of the minimum area of a rectangle can be conducted via the method disclosed in Freeman H. and Shapira R., "Determining the Minimum-Area Encasing Rectangle for an Arbitrary Closed Curve", Communications of the ACM, Vol. 18, Nr. 7, pp. 409-413, 1975.

The "rotating calipers" algorithm can be used to further reduce the calculation time.

Given a rotation with a small rotation angle, the area of a rectangle normally changes only significantly. In order to simplify the number of side surfaces of the acquisition volume, given use of a plurality of rectangles the rotation angles of the rectangles can therefore be standardized. The area of most of the rectangles that (as before) encloses the respective organ cross section is then no longer minimal, but the adjacent side surfaces can be interpolated more easily.

In an embodiment, a polygon can be generated based on the minimized or minimal rectangle in that projecting vertices of the rectangle can be considered as being "shortened" by connection lines. However, each of these connection lines increases the number of vertices of the polygon, which is why more saturation bands are also consequently required in order to generate an acquisition volume with such an outer surface. The number of overlapping regions of the saturation bands also increases with the increasing number of saturation bands, which entails corrections in the calculation of the flip angle of the saturation pulses, the gradient strengths and the temporal and spatial order of the saturation bands. In particular, the saturation effect in the first saturated bands decreases increasingly with a rising number of saturation bands since the magnetization in these regions is partially relaxed again up to the radiation of the excitation pulse of the actual spectroscopic or imaging experiment. The acquisition volume is therefore better adapted to the examination region, whereby partial volume effects are reduced.

A compromise is sought in the increasingly better adaptation of the acquisition volume to the shape of the examined organ or examination region and the resulting, again-degrading signal suppression outside of the examination region. The acquisition volume or its outer contour is therefore simplified so that the tissue surrounding the acquisition volume can be saturated with advantageously eight to twenty saturation bands. The acquisition volume should accordingly have eight to twenty side surfaces.

A random walk method is advantageously used for segmentation. In principle, a number of possibilities are available for automatic segmentation. For example, edge detection algorithms can be used as they are known from image processing. However, the segmentation with a random walk method has turned out to be particularly advantageous. In this, the center of the examination region (and consequently of the acquisition volume) is first established. This can take place via what is known as a "boosted classifier". The images are thereby classified in three or more categories using specific features, wherein the image elements belonging to the desired organ or its cross section ideally fall into only one class. The center of the image elements of this class (that, based on the classification, is directly established as belonging directly to the examination region) can take place by a center of gravity determination. Error corrections to establish outliers can also be further conducted after implementing the classification.

Starting from the center, a random walk method is then executed. This method (which is conventionally applied in financial mathematics for the calculation of stock prices) is based on a random movement, the "random walk". The examination region is thus developed starting from the center.

An acquisition volume to acquire a magnetic resonance data set of the prostate can advantageously be determined. Magnetic resonance acquisitions of the prostate are particularly susceptible to signal contributions from the outside, which is why the method according to the invention is used with particular advantage to determine an acquisition volume of a prostate.

The described method for automatic determination of an acquisition volume with all embodiments can naturally be used within the scope of the preparation of an acquisition (the acquisition of a magnetic resonance data set). It is merely a question of definition whether it is desired to considered the determination of the acquisition volume as part of the acquisition of the magnetic resonance data set or as part of the preparation actions, and to view the acquisition as limited to the time period of the actual data acquisition. The described method for automatic determination of an acquisition volume is in any event used to establish the position of saturation bands, wherein the parameters of the saturation pulses (such as pulse duration, flip angle and number of saturation pulses) as well as of the magnetic field gradient (strengths) to be applied during and after the saturation pulses are set. During the acquisition of magnetic resonance data sets, these saturation bands are used to suppress the signal outside of an established volume. The data acquisition can subsequently take place.

The method for data acquisition can structured as modules. The saturation pulses (which are excitation pulses and are only called this due to the usage purpose) generating the saturation bands and the associated magnetic field gradients thereby form an established sequence that can be adjusted by means of a few parameters. These are preferably the number of excitation pulses and the respective flip angles. In contrast to these, the additional variables (such as the pulse shapes, the pulse durations, and the time interval of the pulses) preferably remain fixed.

A water suppression module (or generally a frequency-selective saturation module) can follow as an additional module before or after the saturation module. In particular in spectroscopic methods and in spectroscopic imaging, such modules are necessary in order to suppress the water signal, which is multiple times higher than the signal of metabolites. Naturally, multiple frequency-selective saturation modules can also be used, for example one for water suppression and one for fat suppression. A known preparation module for frequency-selective saturation or, respectively, signal suppression is known under the name CHESS.

The aforementioned object of the present invention is also achieved with a magnetic resonance system having a basic field magnet, at least three gradient coils to generate magnetic field gradients, at least one excitation coil, a control device; and an evaluation device to determine an acquisition volume. The evaluation device is designed to implement the method described above.

The implementation of the aforementioned method in the control device can take place as software, but also as (hardwired) hardware.

The advantageous embodiments of the method according to the invention correspond to embodiments of the magnetic resonance apparatus according to the invention.

DESCRIPTION OF THE PREFERRED EMBODIMENTS

Figure 1:
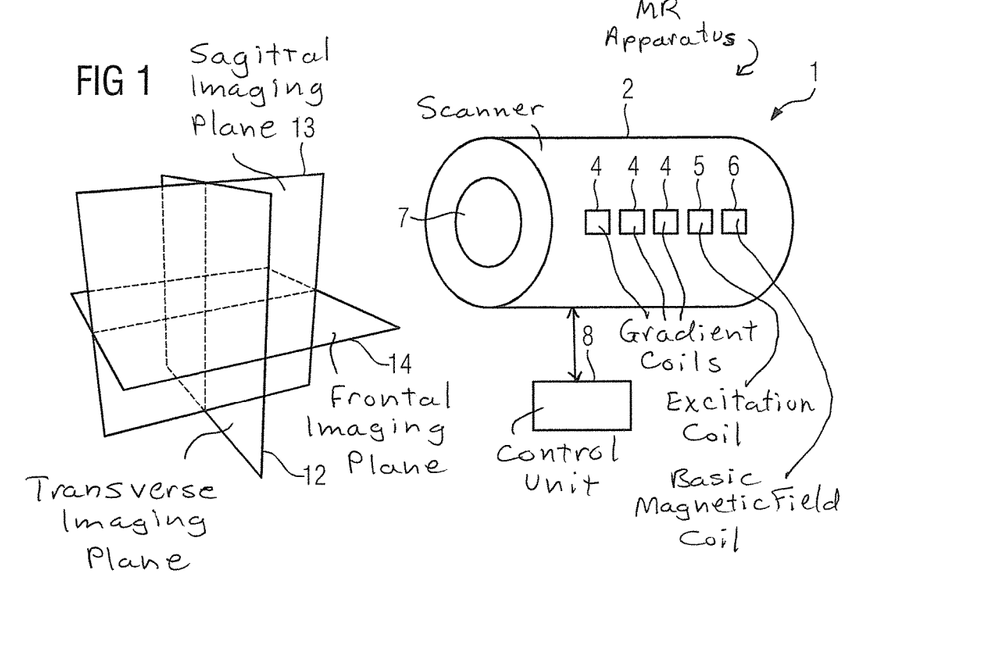
FIG. 1 schematically illustrates a magnetic resonance apparatus according to the invention.

FIG. 1 shows a magnetic resonance apparatus 1 that has a magnet unit (scanner) 2 as well as a control unit 8. Although the magnet unit 2 is designated generally, it is composed of a number of components. For example, it includes three gradient coils 4, an excitation coil 5 to generate RF pulses, and a coil 6 to generate the basic magnetic field B0.

A patient who is moved into the magnet 2 via the opening 7 can be positioned with positioning aids so that the examination region—typically the head or a defined organ, for example the liver, the kidneys or the prostate—lies in the homogenous region of the basic magnetic field B0.

For better orientation, a convention exists for naming primary slice planes that are in particular used in the acquisition of first overview images. The transverse plane 12 lies orthogonally to the longitudinal axis of the patient and divides said patient into an upper part and lower part. The sagittal plane 13 transects the patient in the middle. Images acquired in the sagittal plane 13 show the patient from the side. The frontal plane 14 divides the patient into an anterior half and a posterior half.

Naturally, the acquisition volumes can be positioned completely freely, and not only in parallel with the planes 12, 13 and 14. However, the planes 12, 13 and 14 can be plotted automatically in magnetic resonance images for better orientation. The rotation of the acquisition volume can thereby be graphically represented.

Figure 2:
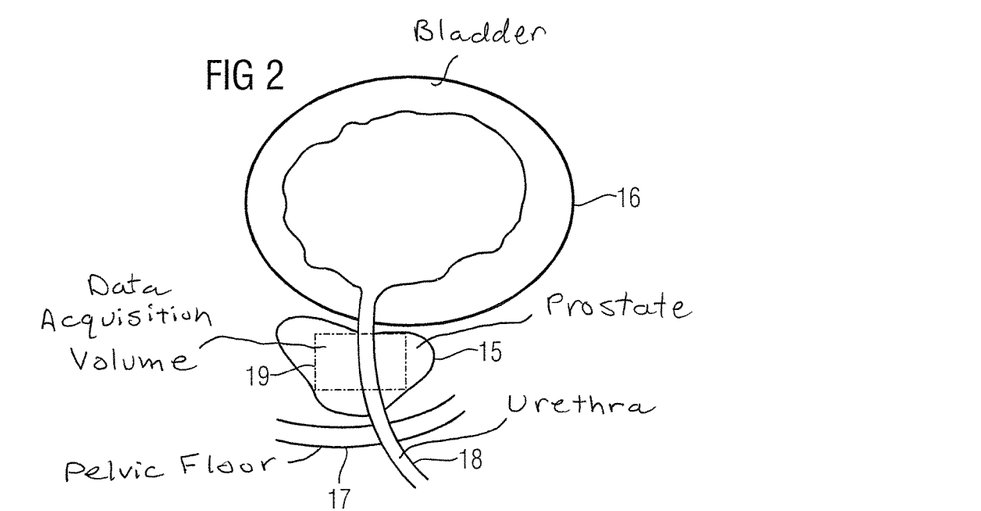
FIG. 2 schematically illustrates an examination region.

FIG. 2 shows a prostate 15 as an example examination region. An examination region can be individual organs or body regions or portions of organs or body regions. An example of a portion of a body region is the white brain matter.

The prostate 15 lies between urinary bladder 16 and pelvic floor 17 and is traversed by the urethra 19. The outer surface of the prostate is therefore irregular and cannot be described by a standard geometric shape.

Spectra of a healthy prostate have a defined ratio of citrate to choline. Given a necrotic prostate, the signal intensity of citrate is decreased and that of choline is increased in comparison to a healthy prostate. The ratio of signal intensities of citrate to choline is thus decreased given necrotic prostate tissue.

Methods of localized spectroscopy can be used to acquire signals that originate only from the prostate. The tissue surrounding the acquisition volume can be saturated before the acquisition volume and the surrounding volume or tissue are excited. With this technique, the read-out signal originates primarily from the acquisition volume.

The saturation takes place as already described with multiple saturation bands. These are more or less cuboid; the precise shape depends on the pulse profile. In order to saturate the tissue outside of a cuboid acquisition volume, at least four to six saturation bands are required depending on whether the slice generated with the excitation pulse exceeds the examination region or not. If inly signals within the prostate 15 should be acquired, a cuboid acquisition volume could be generated that lies entirely within the prostate 15. This is indicated with the rectangle 19 in cross section.

This procedure has the decisive disadvantage that the acquisition volume acquired in such a manner primarily includes the internal space of the prostate 15 and excludes much prostate tissue. The measurement time thereby increases so as to achieve a desired SNR, but the necrotic region, which is the most important region to image, or diagnose with spectroscopic data, may possibly not be included in the acquisition volume.

If the acquisition volume is simply placed only roughly around the prostate 15, however, many signal contributions from surrounding tissue are received.

Therefore, often more than six saturation bands are used in order to image the outer surface of the prostate as well as possible.

According to the invention, an automated method to determine the acquisition volume is thereby used. Inaccuracies that arise when segmentation is done manually can be prevented with this automated method.

The considerations that have been employed with regard to spectroscopic acquisitions apply analogously and additively to normal and spectroscopic imaging.

As used herein "normal imaging" is the acquisition of image data that include no spectroscopic information. This can be implemented with two- and three-dimensional acquisition methods such as FLASH, spin echo, gradient echo, turbo spin echo, TrueFisp, HASTE, GRASE, multi-spin echo, T1 maps, T2 maps etc. The acquisition scheme of k-space can be radial, Cartesian or arbitrarily different.

Spectroscopic imaging includes methods of the type known as "Chemical Shift Imaging" (CSI), for example Acquisition-Weighted CSI (AW-CSI) or Density Weighted CSI (DW-CSI).

In normal and spectroscopic imaging, the problem exists that the nuclear spins in the examination subject can be excited only in the entire cross section defined by the selective excitation, and that enough lines in k-space must be filled in the phase direction so as to achieve a desired resolution. If an image should be acquired with 128×128 image elements, 128 repetitions with respective, changed strengths of the phase gradients are necessary. The achieved resolution depends on the field of view (FoV). The field of view depends on the examination region; it designates the imaged area. The FoV must include the entire cross section of the excited examination volume or of the acquisition volume. However, the region of interest or the volume of interest always pertains only to a portion of the total imaged region or volume. The same resolution could be achieved with a smaller number of repetitions with changing strength of the phase gradients (thus with fewer acquisition steps in the phase direction) if the field of view can be reduced. This is possible in the same manner as described with regard to localized spectroscopy. Because the tissue surrounding the acquisition volume is saturated, the FoV can be reduced and the number of phase steps can be reduced accordingly without changing the resolution.

In three-dimensional imaging, a phase gradient is also switched in the slice direction; the achievable time gain is increased by a corresponding factor. In spectroscopic imaging, a phase gradient is switched in all spatial directions for coding (thus three phase coding gradients given three-dimensional spectroscopic imaging). The achievable time gain results multiplicatively from the individual reductions of the phase steps.

In addition, the problem known as the Partial Volume Effect still exists. Image elements include signal contributions from different tissues, primarily in the edge regions of the examination region. In spectroscopic images, the spectra are accordingly "contaminated". This contamination can also be reduced if the tissue surrounding the acquisition volume has been saturated.

Figure 3:
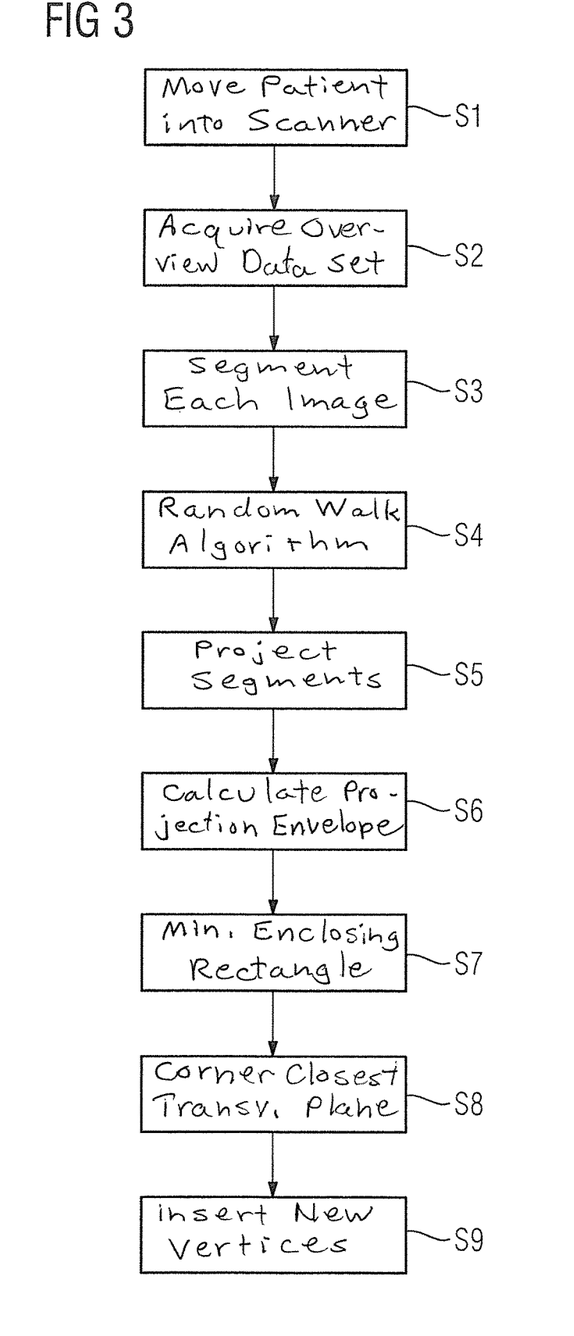
FIG. 3 is a flowchart of an embodiment of the method according to the invention.

FIG. 3 shows a flowchart for the acquisition of a magnetic resonance data set. In Step S1, a patient is slid into the magnet 2, positioned, and the magnetic field is homogenized. In the following Step S2, a T2-weighted 2D multislice spin echo data set of the prostate or of another examination region is acquired as an overview image data set and processed further into image data.

As Step S3, in each image of the overview image data set a segmentation is subsequently executed as what is known as a "Boosted Classifier", and each image is thus segmented with the classification that is thereby produced. Based on the classification parameters, it is established from the outset that the tissue classified in one class is considered to belong to the prostate (in this example).

Using the classification results, in Step S4 a random walk algorithm can be executed in each image that depicts a portion of the prostate. For this purpose, "seeds" are respectively selected inside and outside of the prostate, and a "random walk probability map" is calculated starting from these seeds. The edges of the prostate are respectively identified using this random walk probability map, and segments of the prostate 15 are thus created.

In the next Step S5, the segments are projected in a projection plane. For example, the projection direction can be orthogonal to the sagittal plane 12.

An envelope is subsequently calculated for this projection (Step S6). This includes a few node points via which the entire envelope is defined.

The minimum enclosing rectangle is subsequently determined for the envelope as Step S7. This occurs as described above.

As Step S8, that corner of the rectangle is calculated that lies closest to the transverse plane 12. The first side surface of the acquisition volume is placed via this corner, and in fact parallel to the transverse plane.

The second through fifth side surfaces are situated orthogonally to the first side surface and are predetermined by the determined rectangle. The position of the last side surface of the cuboid acquisition volume results from the overview images since it is parallel to the first side surface and tangential to the examination region (thus the prostate).

The coding directions of the readout, phase coding and slice selection gradients are established based on this cuboid. These are only direction information; only one phase coding gradient could be used.

In the sagittal plane, the readout direction lies along the side of the rectangle 21 that is arranged closest to the transverse plane. The phase direction is situated on this side, orthogonal to the sagittal plane. This concerns only the pure orientation and direction information since (in particular in spectroscopic imaging) no readout gradient is used, but rather only phase coding gradients.

In the following Step S9, the number of side surfaces is increased by inserting new vertices into the rectangle 21 to further reduce the acquisition volume; the number of saturation bands is thus increased.

The parameters of the saturation bands can be calculated from the position of the determined side surfaces. These parameters are stored and provided for subsequent acquisitions of magnetic resonance data sets.

Furthermore, the acquisition parameters directly arise from the position of the side surfaces. For example, the field of view, the position of the slices or planes to be acquired, and the RF pulse and gradient settings required for these can be determined from the side surfaces.

3D CSI data sets acquired within the scope of the evaluation can also be MPR slices (thus projections) that are generated on the transversal plane 12, the sagittal plane 13 or the frontal plane 14. In particular, the projection in the transversal plane 12 is suitable for presentation of the spectra.

Figure 4:
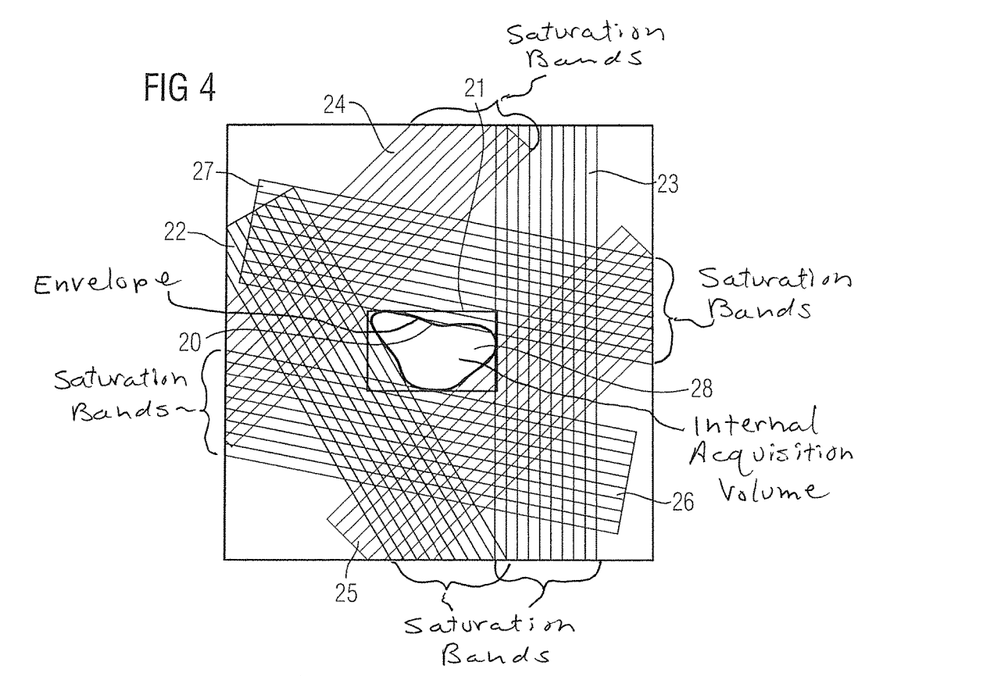
FIG. 4 shows a cross section of an examination region with saturation bands.

FIG. 4 shows a pure example of a cross section of a prostate 15; an envelope 20 enclosing the prostate 15; rectangle 21 derived from the envelope 20; and six saturation bands 22, 23, 24, 25, 26 and 27 that are arranged around the prostate and thus define the internal acquisition volume 28. The envelope 20, the rectangle 21 and the saturation bands 22 through 26 are determined as described above.

The acquisition volume can be used to generate a localized spectroscopy data set, a two-dimensional or three-dimensional image data set, or a two-dimensional or three-dimensional spectroscopic image data set.

Figure 5:
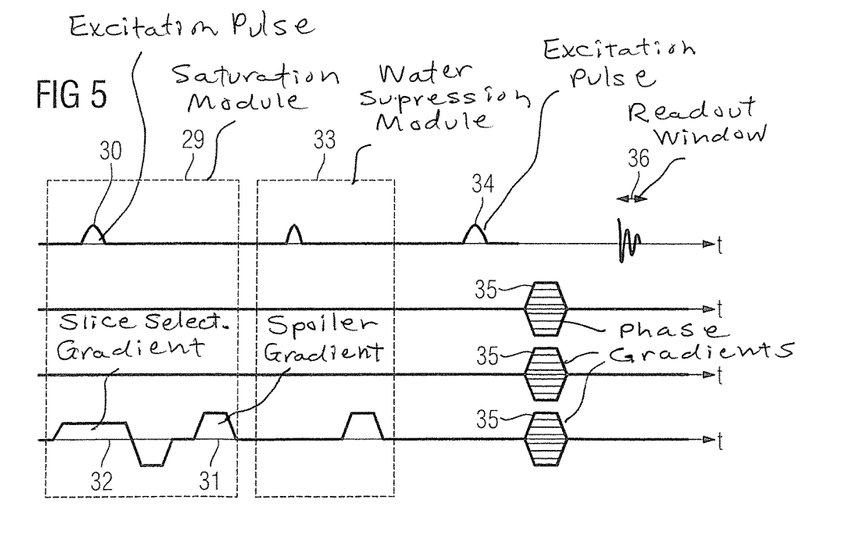
FIG. 5 is a pulse sequence diagram with saturation module usable in accordance with the invention.

FIG. 5 shows an acquisition method for the acquisition of a three-dimensional spectroscopic image data set. This method has a modular design. The saturation module 29 includes a number of successive excitation pulses 30 and spoiler gradients 31 as well as slice selection gradients 32, of which one is respectively shown as an example. A saturation band is generated by each excitation pulse 30. The saturation module 29 thus includes as many excitation pulses 30 as saturation bands that are provided.

The water suppression module 33 produces a frequency-selective saturation of the signal. A known water suppression module is known under the designation "CHESS".

Following the water suppression module 33, arbitrary experiments can be conducted: for example, a k-space point of a three-dimensional spectroscopic imaging method can respectively be acquired. An excitation pulse 34, phase gradients 35 and an acquisition window 36 are accordingly depicted.

The method according to the invention and the magnetic resonance apparatus according to the invention are closely linked with one another, so that features of the invention that have been described as aspects of the method also apply to the magnetic resonance apparatus, and vice versa.

Moreover, features described with regard to individual embodiments can also be realized in other designs or embodiments, unless this is explicitly otherwise described or precluded for technical reasons.

Although modifications and changes may be suggested by those skilled in the art, it is the intention of the inventors to embody within the patent warranted hereon all changes and modifications as reasonably and properly come within the scope of their contribution to the art.

We claim as our invention:

1. A computerized method to automatically determine an acquisition volume from which a magnetic resonance data set is to be acquired, said method comprising:
   operating a magnetic resonance data acquisition unit to acquire at least one preliminary magnetic resonance data set that at least partially encompasses an examination region of a subject;
   in a processor, reconstructing multiple magnetic resonance images from said at least one preliminary magnetic resonance image data set;
   in said processor, automatically segmenting the examination region from each of said multiple magnetic resonance images, thereby obtaining multiple segments of said examination region;
   in said processor, projecting said multiple segments of said examination region into a projection plane;
   in said processor, automatically determining an envelope that encloses the multiple projected segments of said examination region;
   in said processor, automatically determining at least one rectangle that includes said envelope;
   in said processor, automatically calculating the acquisition volume using said rectangle; and
   in said processor, automatically generating, from the acquisition volume calculated using the rectangle, a protocol for operating said magnetic resonance data acquisition unit, said protocol including specifications of respective coding directions for readout, phase coding and slice selection gradients needed to acquire the calculated acquisition volume, and making said protocol available at an output of said processor in an electronic form configured to operate the magnetic resonance data acquisition unit.

2. A method as claimed in claim 1 comprising determining said rectangle at a rectangle that is minimized in area.

3. A method as claimed in claim 2 comprising calculating said rectangle as a rectangle with said area being minimal.

4. A method as claimed in claim 1 comprising projecting the multiple segments orthogonally to the sagittal plane of the subject.

5. A method as claimed in claim 1 comprising projecting the multiple segments along a direction of a major axis of said examination region.

6. A method as claimed in claim 3 comprising calculating said examination volume as a cuboid that has a designated side surface situated parallel to the transverse plane of the subject and that proceeds through a corner of the rectangle nearest the transverse plane, and that has additional side surfaces of the cuboid situated orthogonally to said first side surface and proceeding through respective largest and smallest x-values and y-values of the projected segments.

7. A method as claimed in claim 1 comprising automatically segmenting said examination region by executing a random walk algorithm in said processor.

8. A method as claimed in claim 1 comprising defining said acquisition volume for acquiring said magnetic resonance data set of the prostate of the subject.

9. A method as claimed in claim 1 comprising acquiring said magnetic resonance image data set according to said protocol as a 2D multi-slice image data set.

10. A method as claimed in claim 1 comprising acquiring said magnetic resonance image data set using said protocol as a 3D magnetic resonance image data set.

11. A magnetic resonance apparatus comprising:

a magnetic resonance data acquisition unit;

a control unit configured to operate the magnetic resonance data acquisition unit to acquire at least one preliminary magnetic resonance data set that at least partially encompasses an examination region;

said control unit being configured to reconstruct multiple magnetic resonance images from said at least one preliminary magnetic resonance image data set;

said control unit being configured to automatically segment the examination region from each of said multiple magnetic resonance images, thereby obtaining multiple segments of said examination region;

said processor being configured to project said multiple segments of said examination region into a projection plan;

said control unit being configured to automatically determine an envelope that encloses the multiple projected segments of said examination region;

said control unit being configured to automatically determine at least one rectangle that includes said envelope;

said control unit being configured to automatically calculate the acquisition volume using said rectangle; and said control unit being configured to automatically generate, from the acquisition volume calculated using the rectangle, a protocol for operating said magnetic resonance data acquisition unit, said protocol including specifications of respective coding directions for readout, phase coding and slice selection gradients needed to acquire the calculated acquisition volume, and to make said protocol available at an output of said control unit in an electronic form configured to operate the magnetic resonance data acquisition unit.

* * * * *